United States Patent [19]

Bonner

[11] 4,299,650
[45] Nov. 10, 1981

[54] MINIMIZATION OF STRAIN IN SINGLE CRYSTALS

[75] Inventor: William A. Bonner, Warren, N.J.

[73] Assignee: Bell Telephone Laboratories, Incorporated, Murray Hill, N.Y.

[21] Appl. No.: 84,070

[22] Filed: Oct. 12, 1979

[51] Int. Cl.$^3$ .............................................. C30B 27/02
[52] U.S. Cl. ...................... 156/617 SP; 156/DIG. 70
[58] Field of Search .............. 156/607, 616 A, 616 R, 156/DIG. 70, DIG. 73, DIG. 89, 617 SP

[56] References Cited

U.S. PATENT DOCUMENTS

| | | | |
|---|---|---|---|
| 3,647,389 | 3/1972 | Weiner | 156/DIG. 70 |
| 4,083,748 | 4/1978 | Gault | 156/DIG. 70 |

OTHER PUBLICATIONS

Pamplin, "Crystal Growth", Pergamon Press, New York, Mar. 1975, pp. 515 and 518.
Fischer, "Techniques for Melt-Growth", Appearing *Journal of the Electrochemical Society*, Feb. 1970, vol. 117, No. 2, pp. 41-47.
"Liquid Encapsulation", Mullin et al., Published in *J. of Crystal Growth*, Mar. 1968, vol. 3, #4, pp. 281-285.
"Liquid Encapsulation", Bachmann et al., Published in *J. of Electronic Material*, Apr. 1975, vol. 4, #2, pp. 389-406.
Henry et al., "InP Growth", Published in *J. of Electronic Material*, vol. 7, No. 5, Jul. 1978, pp. 647-657.
Buehler, "Simple Pressure Chambers", Published in *J. of Crystal Growth*, vol. 43, Jan. 1978, pp. 584-588.
Steinemann et al., "Growth Peculiarities", Published in *Solid State Electronics*, vol. 6, Jun. 1963, pp. 597-604.
Marshall et al., "Growth of InP Crystals", Published in *J. of Crystal Growth*, vol. 44, Apr. 1978, pp. 651-652.

*Primary Examiner*—Gregory N. Clements
*Attorney, Agent, or Firm*—Peter A. Businger

[57] ABSTRACT

Single crystals are conveniently produced by directional solidification of a liquid body under a pressurized atmosphere and, preferably, under a liquid encapsulating layer to minimize loss due to volatilization. Such fabrication entails a concern with internal stress in a grown crystal in the interest, e.g., of minimization of breakage of wafers cut from a crystal. According to the invention, minimization of stress is accomplished by means of a post-growth annealing step during which pressure is reduced substantially and, in particular, preferably to a pressure which does not exceed 50 percent of a pressure at which a constituent of the liquid body volatilizes.

The method may be applied for producing single crystals of semiconductor materials as may be used as device substrates. In particular, the method is beneficial, e.g., for producing high-quality doped or undoped InP, GaP, and GaAs single crystals.

6 Claims, No Drawings

MINIMIZATION OF STRAIN IN SINGLE CRYSTALS

TECHNICAL FIELD

The invention is concerned with the production of single crystal materials.

BACKGROUND OF THE INVENTION

Materials in single crystal form play a role in various device applications such as, e.g., semiconductor and, in particular, semiconductor optical devices. Examples of such optical devices are light emitting diodes, laser diodes, optical detectors, opto-isolators, and phototransistors as described, e.g., in the book by A. A. Bergh et al., *Light Emitting Diodes*, Clarendon Press, 1976. Devices may typically comprise a substrate and one or several deposited epitaxial layers, substrate and layers being rendered semiconducting or semi-insulating by the presence of appropriate dopants such as, e.g., S, Se, Sn, Zn, Te, Cd, Cr, or Fe. Among materials considered to be particularly suitable for optical device applications are doped and undoped III-V compounds.

The manufacture of device substrates typically involves cutting wafers from a single crystal boule which may have been produced by controlled solidification from a melt; among controlled solidification techniques, pulling from a melt has proved particularly effective for III-V compounds such as, e.g., indium arsenide, gallium arsenide, gallium phosphide, and indium phosphide. In some instances, pulling may be carried out under atmospheric conditions; in others, pulling is preferably carried out under elevated pressure and from a melt whose surface is protected by an immiscible liquid. Apparatus for carrying out such so-called Liquid Encapsulated Czochralski growth has been disclosed by a number of authors and, in particular, by J. B. Mullin et al., "Liquid Encapsulation Crystal Pulling at High Pressures", *Journal of Crystal Growth*, Vol. 4 (1968), pp. 281–285; K. J. Bachmann et al., "Liquid Encapsulated Czochralski Pulling of InP Crystals", *Journal of Electronic Materials*, Vol. 4 (1975), pp. 389–406; R. L. Henry et al., "InP Growth and Properties", *Journal of Electronic Materials*, Vol. 7 (1978), pp. 647–657; and E. Buehler, "Simple Pressurized Chambers for Liquid Encapsulated Czochralski Crystal Growth", *Journal of Crystal Growth*, Vol 43 (1978), pp. 584–588, the latter giving details of construction and operation of apparatus.

Quality of pulled crystals depends on the appropriate choice of various processing parameters such as, e.g., melt composition, pressure, temperature, pull rate, and rate of rotation of a crystal being pulled. One concern in selecting processing parameters is with the minimization of twinning as documented, e.g., by A. Steinemann et al., "Growth Peculiarities of Gallium Arsenide Single Crystals", *Solid State Electronics*, Vol. 6 (1963), Pergamon Press, pp. 597–604; by A. J. Marshall et al., "Growth of InP Crystals by the Synthesis Solute Diffusion Method", *Journal of Crystal Growth*, Vol. 44 (1978), pp. 651–652; and U.S. patent application Ser. No. 47,214, filed June 11, 1979, by W. A. Bonner. There is a further concern with physical integrity of wafers cut from a crystal, i.e., with minimizing the likelihood of wafer breakage. This concern is related to minimization of strain in pulled crystals.

SUMMARY OF THE INVENTION

Crystals which are essentially free from internal strain are produced by a method comprising a step of controlled solidification by directional cooling of a liquid body under pressure. Upon completion of solidification, pressure is reduced while temperature stays approximately constant; once pressure has been reduced to preferably less than or equal to 50 percent of a critical pressure, temperature is lowered to ambient temperature. Critical pressure is defined as the lowest pressure which is sufficient to essentially prevent volatilization of a constituent of the liquid body.

Crystals made according to the new method have a smooth surface and more uniform dislocation density. Furthermore, resulting crystals have minimal tendency to crack during wafering. Devices made from such wafers exhibit desirably uniform operating characteristics.

DETAILED DESCRIPTION

Strain minimization in single crystals is effected in the course of crystal fabrication by controlled solidification of a liquid body such as, e.g., a solution or a melt of a material having desired stoichiometric composition. A liquid body is prepared by heating, e.g., by resistance heating or by induction heating a suitable susceptor surrounding a crucible containing constituents. Typical crucible materials are fused silica and pyrolytic boron nitride. Exemplary apparatus is depicted in references cited above. A liquid encapsulating layer may be provided over the surface of the liquid body, and a pressurized, preferably inert atmosphere is supplied at a pressure sufficient to minimize loss of constituents through volatilization as may occur, e.g., upon dissociation of two constituents. Dissociation is particularly detrimental when it leads to a change in the stoichiometry of the liquid body as may be determined, e.g., by chemical or X-ray analysis.

Pressure may be applied before melting, or gradually while temperature is being raised. An encapsulating material typically has a lower melting point than an underlying liquid body; this is the case, e.g., when a boron trioxide encapsulant layer is used on an indium phosphide semiconductor melt.

Solidification is by directionally cooling the liquid body, e.g., by progressive movement from a warmer to a cooler region, either horizontally or vertically. This may involve contacting a surface of the liquid body with a seed crystal having desired crystallographic alignment; crystal growth occurs at the liquid-solid interface upon slowly pulling, i.e., raising the seed crystal or lowering the crucible. Pull rates may typically be about 10–20 mm per hour and, in the interest of growing twin-free crystals, are preferably selected so as to result in the growth of a boule having limited vertical angle as disclosed in U.S. patent application Ser. No. 47,214. Processing parameters such as, e.g., melt temperature, rotation rate, and pull rate may be conveniently monitored by visual inspection of a growing crystal boule. As a growing crystal boule is pulled through an encapsulant layer, a thin skin of encapsulant material may typically adhere to its surface.

Upon completion of crystal growth, and before removal of a grown crystal from the pressure chamber, pressure is lowered substantially, and preferably to less than or equal to 50 percent of a critical pressure while temperature of the crystal boule is maintained approximately constant and preferably not less than 90 percent of the average temperature in degrees Kelvin of the crystal boule upon completion of growth. The critical pressure is defined as the lowest pressure sufficient to essentially prevent volatilization of any constituent of the liquid body from which the crystal was grown. For example, in the case of a melt of indium phosphide covered with an encapsulating layer of boron trioxide, critical pressure is approximately 28 atmospheres pure dry nitrogen.

If pressure is only partially released prior to cooling, further release of pressure may be effected gradually during subsequent cooling of the boule. Rate of pressure decrease is relatively unimportant, a rate of 1 atm per minute being convenient. While pressure is lowered, temperature is maintained, e.g., by power input to the radio frequency susceptor, resulting in heating of the crystal by radiation and conduction via the supplied atmosphere. Alternatively or additionally, heat may be supplied by one or several separate or auxiliary heaters.

Heating preferably is sufficient for an encapsulant skin on the crystal to remain soft during release of pressure so as to maximize stress relief and to minimize the effects of differential thermal contraction between encapsulant skin and grown crystal. For example, heating at a temperature in a preferred range of 550–650 degrees C. is appropriate for a $B_2O_3$ encapsulant. Cooling after release of pressure is preferably at rates not exceeding 20 degrees C. per minute.

The procedure described above may be interpreted in terms of a post-growth annealing treatment in the course of which pressure is lowered. Such treatment has been found to reduce internal stress as may be growth induced or as may be due to differential contraction of crystal and an encapsulant skin adhering to the crystal after growth. In terms of ultimate desired properties, minimization of internal stress is manifested, e.g., by minimization of cracking during wafering, by sharp, clear cleavage, and by uniformity of device characteristics when wafers are used as device substrates.

The method is applicable, e.g., to doped or undoped semiconductor compounds such as, e.g., InP and GaP as well as to multicomponent semiconductor compounds such as, e.g., ternary and quaternary congruently melting compounds. Impurities may be present so as to result in fewer than $10^{15}$ free carriers per $cm^3$ as in materials considered nominally undoped, or they may be present in amounts typically yielding up to $5 \times 10^{18}$ per $cm^3$ or more n- or p-type carriers.

The method may also be used for the growth of single crystal metals, preferably from a melt covered, e.g., with a suitable oxide or halide encapsulant. Furthermore, single crystal oxides may be grown from melts which may be covered, e.g., with immiscible metallic encapsulants.

EXAMPLE

Indium phosphide boules weighing approximately 100 gm and having a diameter of approximately 30 mm and a length of approximately 80 mm were made as follows. Polycrystalline InP was placed in a fused silica crucible and covered with a $B_2O_3$ layer. Crucible dimensions were a diameter of 38 mm and a depth of 50 mm; the crucible had a hemispherical bottom. $B_2O_3$ was 0.999999 pure, anhydrous, and completely degassed.

The filled crucible was placed in the growth chamber in a graphite susceptor, the chamber was evacuated, purged with nitrogen, and again evacuated, and a 20 kW, 450 kilocycle radio frequency generator was coupled to the susceptor. The charge was slowly heated under vacuum to the softening point of $B_2O_3$ at approximately 600 degrees C. While the temperature was gradually raised further to approximately 1060–1070 degrees C., the chamber was filled with nitrogen and pressure gradually raised to approximately 38 atm. A seed crystal having (111)-direction vertical was preheated while it was lowered at the end of a pull rod through the $B_2O_3$ layer, and brought into contact with the surface of the InP melt. The pull rod was rotated at approximately 25 RPM and withdrawn at a rate of approximately 15 mm per hour. The grown crystal was maintained at a temperature in excess of 600 degrees C. while pressure was lowered at a rate of approximately 1 atm per hour to ambient pressure. The crystal was then cooled at a rate of approximately 10 degrees C. per minute to ambient temperature. A smooth-surfaced single crystal boule was obtained.

I claim:

1. Method for making a single crystal boule of a material which consists essentially of doped or undoped indium phosphide, said method comprising the steps of
    (1) heating to produce a liquid body of said material which is provided with an overlying liquid encapsulating layer,
    (2) providing over said liquid encapsulating layer an atmosphere,
    (3) pulling said boule from said liquid body through said liquid encapsulating layer while said atmosphere is at a first pressure which is greater than or equal to a critical pressure, said critical pressure being defined as the lowest pressure sufficient to essentially prevent dissociation of said constituents,
    (4) reducing pressure of said atmosphere from said first pressure to a second pressure which is less than or equal to 50 percent of said critical pressure while temperature of said boule is greater than or equal to 90 percent of the average temperature of said boule upon completion of growth of said boule, and
    (5) cooling said boule to ambient temperature.

2. Method of claim 1 in which pressure of said atmosphere is reduced further from said second pressure during cooling said boule.

3. Method of claim 1 in which said liquid body is a melt or a solution.

4. Method of claim 1 in which cooling said boule is at rates less than or equal to 20 degrees C. per minute.

5. Method of claim 1 in which said boule is at a temperature at which the material of said layer is soft while pressure of said atmosphere is reduced from said first pressure to said second pressure.

6. Method of claim 1 in which the material of said layer consists essentially of boron trioxide, in which said first pressure is greater than or equal to 28 atm, and in which said boule is heated at a temperature in a range of 550–650 degrees C. while pressure of said atmosphere is reduced from said first pressure to said second pressure.

* * * * *